United States Patent
Ohhira

(10) Patent No.: US 8,647,980 B2
(45) Date of Patent: Feb. 11, 2014

(54) METHOD OF FORMING WIRING AND METHOD OF MANUFACTURING SEMICONDUCTOR SUBSTRATES

(75) Inventor: Shinya Ohhira, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/581,202

(22) PCT Filed: Feb. 17, 2011

(86) PCT No.: PCT/JP2011/053406
§ 371 (c)(1),
(2), (4) Date: Aug. 24, 2012

(87) PCT Pub. No.: WO2011/105282
PCT Pub. Date: Sep. 1, 2011

(65) Prior Publication Data
US 2012/0315757 A1    Dec. 13, 2012

(30) Foreign Application Priority Data

Feb. 25, 2010 (JP) ................................ 2010-040795

(51) Int. Cl.
*H01L 21/44* (2006.01)
(52) U.S. Cl.
USPC .......... 438/656; 438/660; 438/687; 438/715; 438/717; 257/E21.585
(58) Field of Classification Search
None
See application file for complete search history.

(56) References Cited

U.S. PATENT DOCUMENTS

| | | | |
|---|---|---|---|
| 5,407,530 A | 4/1995 | Watanabe et al. | |
| 5,472,895 A | 12/1995 | Park | |
| 6,117,785 A | 9/2000 | Lee et al. | |
| 7,229,569 B1 | 6/2007 | Seki et al. | |
| 2005/0153549 A1* | 7/2005 | Cho | 438/687 |
| 2007/0212889 A1* | 9/2007 | Abatchev et al. | 438/717 |

FOREIGN PATENT DOCUMENTS

| | | |
|---|---|---|
| JP | 55-138260 A | 10/1980 |
| JP | 1-265539 A | 10/1989 |
| JP | 3-048489 A | 3/1991 |
| JP | 5-061185 A | 3/1993 |
| JP | 6-021017 A | 1/1994 |
| JP | 6-215329 A | 8/1994 |
| JP | H07-58108 A | 3/1995 |
| JP | 7-326751 A | 12/1995 |
| JP | 10-107144 A | 4/1998 |
| JP | 2001-059191 A | 3/2001 |

OTHER PUBLICATIONS

International Search Report (ISR) issued in PCT/JP2011/053406 mailed in Apr. 2011.

* cited by examiner

*Primary Examiner* — Kyoung Lee
(74) *Attorney, Agent, or Firm* — Chen Yoshimura LLP

(57) ABSTRACT

Disclosed is a method of forming wiring. The method includes the steps of: depositing a metal thin film (12) of copper (Cu) on a glass substrate (11) serving as a base; forming an insulating film or a metal insulating film (131) containing no Cu on the metal thin film (12); patterning a photoresist (14) by photolithography on the insulating film (131); etching a liner film (13) by isotropic dry etching using the photoresist (14) as an etching mask; and after the etching of the liner film (13), removing the photoresist (14), and then removing part of the metal thin film (12) by isotropic wet etching using the liner film (13) as an etching mask, thereby forming metal wiring (12*a*).

5 Claims, 9 Drawing Sheets

(a)

(b)

(c)

(d)

(e)

(a)

Cu Wiring (b)

Cu Wiring (a)

(b)

(c)

(d)

(e)

(a)

(b)

(c)

(d)

(a)

(b)

(c)

(d)

(a)

(b)

(c)

(d)

(a)

(b)

(c)

(d)

(a)

(b)

METHOD OF FORMING WIRING AND METHOD OF MANUFACTURING SEMICONDUCTOR SUBSTRATES

TECHNICAL FIELD

The present invention relates to a method of forming Cu wiring on a substrate and to a method of manufacturing a semiconductor substrate that includes the Cu wiring therein.

BACKGROUND ART

When wiring in semiconductor devices is reduced to a microscopic size so as to highly integrate the semiconductor devices, and when current density of the wiring is increased so as to improve operation speed of the semiconductor devices, a problem of the wiring becoming less reliable due to electromigration occurs.

Al wiring, which is widely used in the current semiconductor devices, has a low electromigration resistance. Therefore, various materials for wiring to replace the Al wiring have been examined. Cu is attracting attention as one of the materials for wiring to replace Al.

Methods of forming Cu wiring includes a method of forming a photoresist as a resist on a Cu thin film that is formed on a substrate, patterning the resist by the photolithography, and etching the thin film by isotropic wet etching.

This method, however, causes a problem of reducing the width or height in part of the wiring as shown in FIG. 2(a), resulting in a disconnection of the wiring or an increase of resistance.

This problem arises because a surface of the Cu thin film tends to have a surface reaction such as oxidation at a relatively low temperature, which makes the surface condition thereof not stable. Depending on the surface condition of the Cu thin film, adhesion between the Cu thin film and the photoresist may be significantly decreased.

If the adhesion between the photoresist and the surface of the Cu thin film is weak, when forming the photoresist on the Cu thin film and patterning the photoresist, part of the resist comes off. Consequently, the above problem arises.

As described above, if the resist is not adhered firmly to the surface of the Cu thin film, the wiring cannot be formed to the design dimensions (the width and the height of the wiring).

Patent Document 1 discloses a technique of etching Cu in a shape of wiring by the RIE (Reactive Ion Etching) method, which is anisotropic etching.

In this technique of forming the Cu wiring, as shown in FIG. 9(a), a TiN barrier layer 112 (lower barrier layer), a Cu layer 114, and a TiN barrier layer 116 (upper barrier layer) are deposited in this order on a base 110. Thereafter, an $SiO_2$ etching mask 118a is formed on the TiN barrier layer 116, which is the upper barrier layer.

Next, by the RIE method, the upper TiN barrier layer 116, the Cu layer 114, and the lower TiN barrier layer 112 are etched in this order in the shape of the wiring over the etching mask.

Here, a mixed gas containing $SiCl_4$, $Cl_2$, and $N_2$, for example, is used as an etching gas. As the upper TiN barrier layer 116, the Cu layer 114, and the lower TiN barrier layer 112 are etched as shown in FIG. 9(b) by controlling the atomic ratio of Si to Cl in the etching gas, an $SiO_xN_y$ barrier layer as a sidewall barrier layer 122 is deposited on sidewalls of the etched layers.

As described above, in the technique of forming the Cu wiring disclosed in Patent Document 1, when the Cu layer is etched, reaction products are formed from the etching mask and the reactive etching gas. The reaction products are deposited on side surfaces 1141 where the Cu layer is etched, forming the sidewall barrier layer 122.

Therefore, the sidewall barrier layer 122 can be formed while etching the layers, thereby eliminating a heat treatment for forming the sidewall barrier layer 122. Consequently, the sidewall barrier layer 122 can be formed at such a low temperature that semiconductor elements are not degraded.

RELATED ART DOCUMENT

Patent Document

Patent Document 1: Japanese Patent Application Laid-Open Publication No. H7-58108 (Publication Date: Mar. 3, 1995)

SUMMARY OF THE INVENTION

Problems to be Solved by the Invention

If anisotropic dry etching is performed by the RIE method as in the technique described in Patent Document 1, finer patterning is possible as compared to the method in which the wiring is patterned by wet etching.

The RIE method, however, requires a special device such as a vacuum chamber (reaction chamber 123 shown in FIGS. 9(a) and 9(b)), causing a problem of higher manufacturing cost.

In addition, Cu has a low reaction vapor pressure and the reaction speed thereof is therefore very slow, causing the etching speed to be very slow in dry etching by the RIE method, which results in another problem of low productivity.

The present invention was made in view of the above-mentioned problems, and aims at providing a method of forming the Cu wiring to design dimensions by employing wet etching.

Means for Solving the Problems

In order to solve the above-mentioned problems, a method of forming wiring includes: depositing a metal thin film that contains Cu on a base member; forming, on the metal thin film, an insulating film or a metal film that does not contain Cu (i.e., a film chosen from a group of (1) an insulating film and (2) a metal film that does not contain Cu); patterning a photoresist by photolithography on the insulating film or the metal film that does not contain Cu; etching the insulating film or the metal film that does not contain Cu by isotropic dry etching using the photoresist as an etching mask; and forming metal wiring by removing the photoresist after the insulating film or the metal film that does not contain Cu is etched, and etching the metal thin film by isotropic wet etching using the insulating film or the metal film that does not contain Cu as an etching mask so as to partially remove the metal thin film.

In the method described above, the insulating film or the metal film that does not contain Cu is formed, as a liner film that has an etching selectivity, between the metal thin film that contains Cu and the photoresist.

The surface condition of the insulating film or the metal film that does not contain Cu is less likely to cause a reaction such as oxidation as compared to that of Cu, and therefore is stable. Thus, the adhesion between the insulating film (or the metal film that does not contain Cu) and the photoresist is stronger than the adhesion between the metal thin film that contains Cu and the photoresist. Therefore, if the insulating film or the metal film that does not contain Cu is formed on the metal thin film and the photoresist is formed thereon, the photoresist can be prevented from coming off.

That is, according to the method described above, by sandwiching the insulating film or the metal film that does not contain Cu between the photoresist and the metal thin film, the following effect can be achieved: because the adhesion between the photoresist and the metal thin film to be etched is increased, partial deformation of a wiring pattern in forming the wiring can be reduced, and therefore, a wiring defect or the like that causes an increase of wiring resistance and a wiring disconnection can be eliminated.

According to the method described above, even if the wet etching, which requires simpler equipment and process, is used to form the metal wiring, the metal wiring that is made of Cu can be formed in design dimensions. The metal thin film that contains Cu has a problem of very low etching speed when processed with dry etching by the RIE method, however, the above-mentioned method of the present invention employs the wet etching, which allows the metal thin film to be processed at an appropriate speed, and as a result, high productivity can be maintained.

In order to solve the above-mentioned problems, in a method of manufacturing a semiconductor substrate, semiconductor elements and wiring are formed by patterning a gate electrode layer and a source electrode layer that contain Cu, employing the above method of forming the wiring.

According to the above manufacturing method, when using a Cu conductive film as a wiring material, an effect in which the wiring can be formed to design width and height can be achieved.

Effects of the Invention

As described above, the method of forming wiring includes: depositing a metal thin film that contains Cu on a base member; forming an insulating film or a metal film that does not contain Cu on the metal thin film; patterning a photoresist by the photolithography on the insulating film or the metal film that does not contain Cu; etching the insulating film or the metal film that does not contain Cu by isotropic dry etching using the photoresist as an etching mask; and forming metal wiring by removing the photoresist after the insulating film or the metal film that does not contain Cu is etched, and etching the metal thin film by isotropic wet etching using the insulating film or the metal film that does not contain Cu as an etching mask so as to remove the metal thin film.

According to the method described above, an effect in which metal wiring made of Cu can be formed to design dimensions can be achieved even when the wet etching, which can be performed with simpler equipment and process, is used in forming the metal wiring.

BRIEF DESCRIPTION OF THE DRAWINGS

FIGS. 6(a) to 6(d) respectively correspond to FIGS. 5(a) to 5(d).

FIGS. 7(a) to 7(d) show steps that are performed after the steps shown in FIG. 5.

FIGS. 8(a) to 8(d) respectively correspond to FIGS. 7(a) to 7(d).

DETAILED DESCRIPTION OF EMBODIMENTS

Embodiments of the present invention will be described below with reference to FIGS. 1(a) to 1(e) through FIGS. 8(a) to 8(d). Embodiments of the present invention are not limited to the following.

In the present embodiment, a method of forming wiring that is made of a copper thin film (Cu thin film) on a substrate will be described first. Next, a method of manufacturing a semiconductor substrate that contains Cu wiring as metal wiring by applying such a method of forming the Cu wiring will be described.

<Method of Forming Cu Wiring>

FIGS. 1(a) to 1(e) are explanatory diagrams for a method of forming the Cu wiring in the present embodiment. FIGS. 1(a) to 1(e) are cross-sectional views in process sequence showing how the Cu wiring is formed on a substrate according to the method of forming the Cu wiring in the present embodiment.

Figure 1:
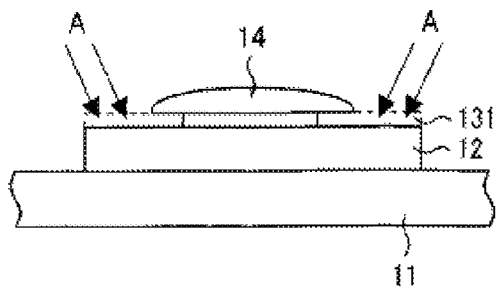
FIGS. 1(a) to 1(e) are explanatory diagrams for process steps in a method of forming wiring according to an embodiment of the present invention.
Figure 1:
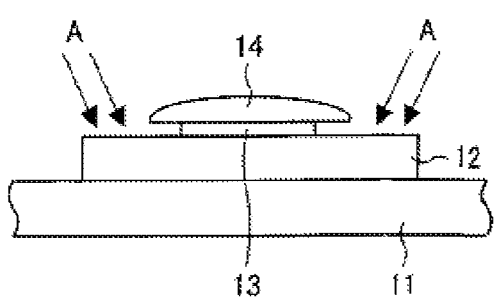
Figure 1:
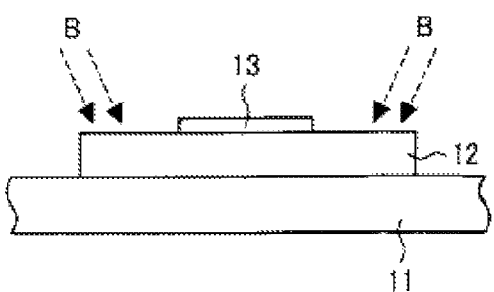
Figure 1:
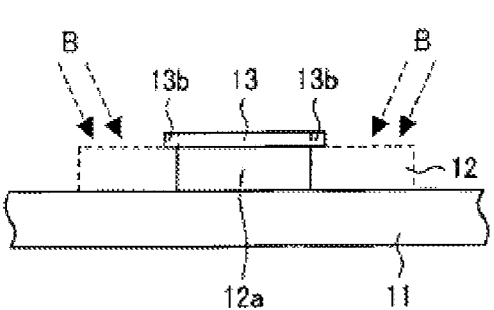
Figure 1:
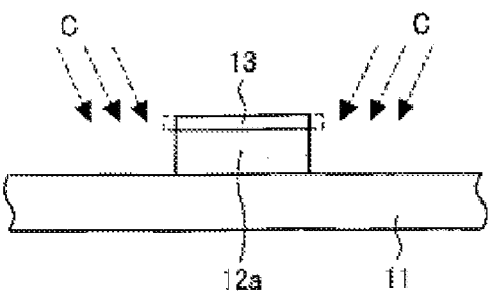

As shown in FIG. 1(a), first, on a glass substrate 11 (substrate), a Cu thin film 12 is deposited as a main conductive film by sputtering. The thickness of the Cu thin film 12 can be 300 to 400 nm, for example.

Thereafter, on the Cu thin film 12, an insulating film 131 that is used as a liner film 13 (see FIG. 1(b)) is formed by the CVD (Chemical Vapor Deposition) method. For the liner film 13, instead of the insulating film, a metal film that does not contain Cu may be used.

For the material of the insulating film 131, SiN (silicon nitride) or SiON (silicon oxynitride), for example, can be used.

If the liner film 13 is a metal film, the metal film may be formed by sputtering, for example. For the material of the metal film, Mo (molybdenum), W (tungsten), Cr (chrome), MoN (molybdenum nitride), TiN (titanium nitride), WN (tungsten nitride), and the like, can be given as examples.

The insulating film 131 may have a multilayer structure of SiON and a PSG (phosphorus-doped glass) film or the like. The thickness of the insulating film 131 may be 20 to 50 nm, for example.

Further, although not shown, a barrier film (lower-layer barrier film) that is constituted of Ti or the like may be deposited under the main conductive film by sputtering in a thickness of 20 to 30 nm, for example, and a Cu thin film, which is the main conductive film, may be deposited thereon.

The barrier film that is constituted of Ti or the like may be etched and patterned at the same time as etching the Cu thin film, or depending on the barrier film, it may be etched by dry etching. In the dry etching, a chlorine gas is used, and a pressure of several Tons to several tens of Torrs is applied, for example.

Next, a photoresist 14 with a thickness of 2.0 μm is applied on the insulating film 131, and the photoresist is patterned in a prescribed shape by the photolithography.

Thereafter, using a mixed gas of $CF_4$ and $C_2F_6$ or a mixed gas of $CF_4$ or $C_2F_6$ with $O_2$ added, for example, isotropic dry etching such as plasma etching (hereinafter referred to as "dry etching A") is performed as shown by the solid arrows A in FIGS. 1(a) and 1(b), and a part of the insulating film 131 that is exposed from the photoresist 14 is removed.

In the isotropic dry etching A, the photoresist 14 serves as an etching mask. The part of the insulating film 131 that is removed is shown by the dashed line in FIG. 1(a).

For the isotropic dry etching A, instead of plasma etching, RIE, high-density plasma etching, or the like, for example, may be employed.

As a result, as shown in FIG. 1(b), the liner film 13, which is the remaining insulating film 131 after the etching, is formed only at a part under the photoresist 14.

When the isotropic dry etching A is performed, regions in the insulating film 131 near edges of the photoresist 14 are etched and removed even though the regions are covered by the photoresist 14. That is, as shown in FIG. 1(b), the photoresist 14 on the liner film 13 that is constituted of the insulating film 131 has a protruding, eaves-like shape at its edges.

Next, as shown in FIG. 1(c), the photoresist 14 is removed using a removing solution (organic solvent, for example) or the like. Thereafter, the Cu thin film 12 is etched by isotropic wet etching using the liner film 13 as an etching mask (hereinafter referred to as "wet etching B") as shown by the dashed arrows B in FIGS. 1(c) and 1(d), partially removing the Cu thin film 12 (Cu conductive film), which is the main conductive film.

Details of the method of the isotropic wet etching B are as follows, for example: a mixed solution of $H_2O_2$, $H_2SO_4$, $HNO_3$, or the like is used; a temperature of the solution is set to 20 to 40° C.; and the mixed solution is applied by spraying (showering) it on a substrate so as to etch the film.

By performing the isotropic wet etching B under these conditions, only the Cu thin film 12 is isotropically etched without removing the liner film 13 that is made of the insulating film 131, which is formed of SiN.

The isotropic wet etching B has the following advantages as compared to dry etching such as the RIE method, for example: (I) a number of substrates can be processed at once; (II) costs of equipment and solutions are low; (III) there are many options for the etching mask, and less damage occurs on a base member that undergoes etching; and the like, for example.

As a result, as shown in FIG. 1(d), Cu wiring 12a formed by patterning the Cu thin film 12 in a prescribed shape can be obtained.

In FIG. 1(d), the Cu thin film 12 that is removed by the isotropic wet etching B is shown by the dashed line.

When the isotropic wet etching B is performed, regions in the Cu thin film 12 near edges of the liner film 13 are etched and removed even though the regions are covered by the liner film 13. That is, as shown in FIG. 1(d), the liner film 13 on the Cu wiring 12a has a protruding, eaves-like shape at its edges 13b.

Thereafter, as shown by the one-dot chain line arrows C in FIG. 1(e), sputter etching is performed using Ar ions (hereinafter referred to as "Ar sputter etching"), and the edges 13b of the liner film 13 that protrude in an eaves-like shape over the Cu wiring 12a are removed.

Details of the method of the Ar sputter etching are as follows, for example: applying a high direct voltage between electrodes that respectively face a substrate while introducing an Ar gas into vacuum, thereby generating Ar+ ions that are the ionized Ar gas; and applying a bias voltage to the substrate so as to start the sputter etching.

According to the process described above, the Cu wiring 12a can be formed on the glass substrate 11.

<Effects Obtained by Above Method of Forming Cu Wiring>

According to the method of forming the Cu wiring described above, by depositing, on the Cu thin film 12, the insulating film 131 (SiN film, for example) that becomes the liner film 13, and by forming and patterning the photosensitive photoresist 14 thereon, the adhesion between the Cu thin film 12 to be processed and the photoresist 14 (indirect adhesion therebetween through the liner film 13) is improved.

More specifically, the insulating film 131 (i.e., the liner film 13), which has more stable surface condition as compared to that of the Cu thin film 12, and the photoresist 14 are laminated with a stronger adhesion.

As a result, the following effect can be achieved: because local deformation of a wiring pattern in forming the wiring can be reduced, a wiring defect or the like that causes an increase of wiring resistance and a wiring disconnection can be eliminated.

As described above, the adhesion between a resist such as the photoresist 14 and an object to be adhered to the resist is affected largely by a condition of the topmost surface where the resist is applied. The surface condition of the liner film 13 is more stable than that of the Cu thin film 12 (especially in terms of oxidation).

Figure 2:
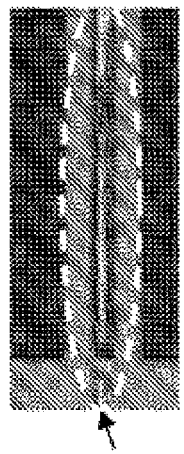
FIG. 2(a) is a schematic view showing an example of a configuration of Cu wiring that is formed according to a conventional method of forming the wiring.
FIG. 2(b) is a schematic view showing an example of a configuration of the Cu wiring that is formed according to the method of forming the wiring of the present embodiment.
Figure 2:
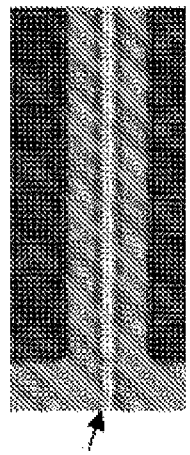

FIG. 2(b) shows an example of a structure of the Cu wiring that is formed by the method of the present embodiment. Here, for comparison, FIG. 2(a) shows an example of a structure of the Cu wiring that is formed by a conventional method of forming the wiring (method in which a photoresist is directly formed on a Cu thin film).

When the Cu wiring is formed by the conventional method, because the adhesion between the photoresist and the surface of the Cu thin film is weak, the photoresist locally comes off at places. Therefore, the wiring cannot be formed to the design width and height. As a result, a problem of a deformed wiring pattern as shown in FIG. 2(a) arises.

On the other hand, when the Cu wiring is formed by the method of the present embodiment, by sandwiching the insulating film (liner film) between the photoresist and the Cu thin film, the adhesion between the photoresist and the Cu thin film is improved, thereby reducing the local deformation of the wiring pattern in forming the wiring.

As a result, as shown in FIG. 2(b), a wiring defect or the like that causes an increase of wiring resistance and a wiring disconnection can be eliminated.

Here, the method of forming the Cu wiring on the glass substrate is shown as an example, but the present embodiment is not limited to such. That is, there is no special limitation on the substrate that serves as a base layer of the Cu wiring. Further, the above method can also be applied to a case where an insulating film and the like are formed on a glass substrate and the Cu wiring is formed on the insulating film.

<Modification Example of Method of Forming Cu Wiring>

FIGS. 3(a) to 3(e) show another example of the method of forming the Cu wiring of the present embodiment.

Figure 3:
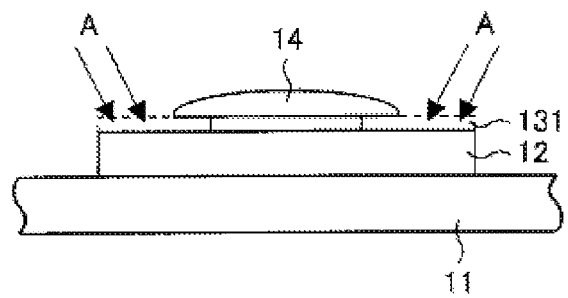
FIGS. 3(a) to 3(e) are explanatory diagrams for another example of the method of forming the wiring of the present invention.
Figure 3:
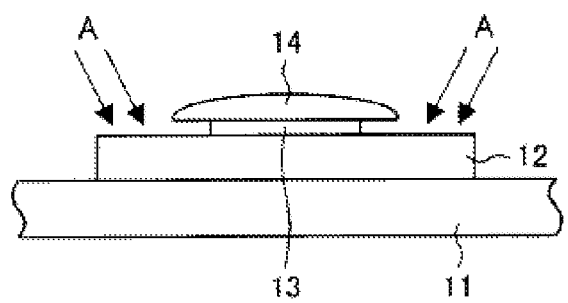
Figure 3:
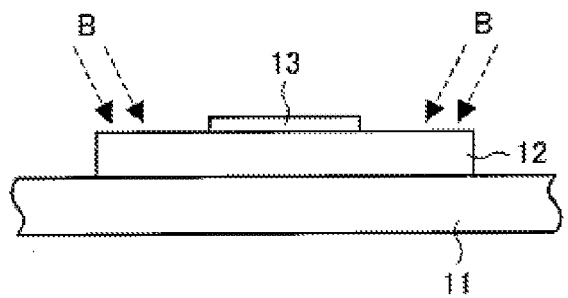
Figure 3:
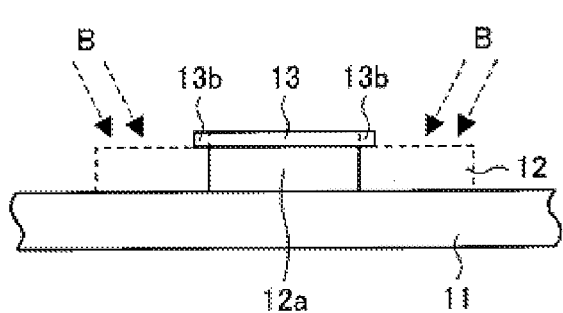
Figure 3:
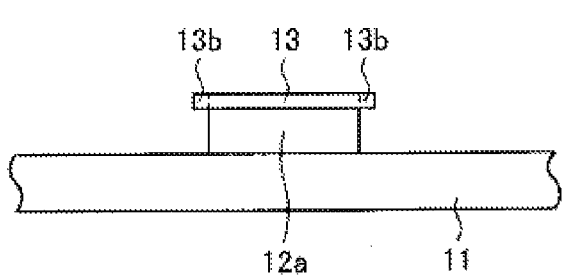

In the method of forming the Cu wiring shown in FIG. 3, a step of removing, by Ar sputter etching, the edges 13b of the liner film 13 that protrude in an eaves-like shape over the Cu wiring 12a shown in FIG. 1(e) is omitted.

Other steps (i.e., respective steps shown in FIGS. 3(a) to 3(d)) are the same as the respective steps shown in FIGS. 1(a) to 1(d).

In a semiconductor device to be formed, if presence of the eaves-shaped edges 13b of the liner film 13 causes no quality problem, the method of forming the Cu wiring shown in FIGS. 3(a) to 3(e) can be used, thereby simplifying the process.

As shown in FIG. 3(e), in this method of forming the wiring, the liner film 13 that is constituted of the insulating film 131 and that has the eaves-shaped edges 13b remaining therewith is formed on the Cu wiring 12a.

Figure 8:
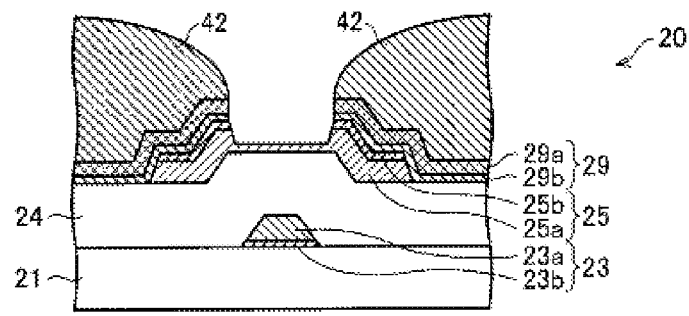
FIGS. 8(a) to 8(d) are cross-sectional views for explaining the process steps in the method of manufacturing the semiconductor substrate according to an embodiment of the present invention.
Figure 8:
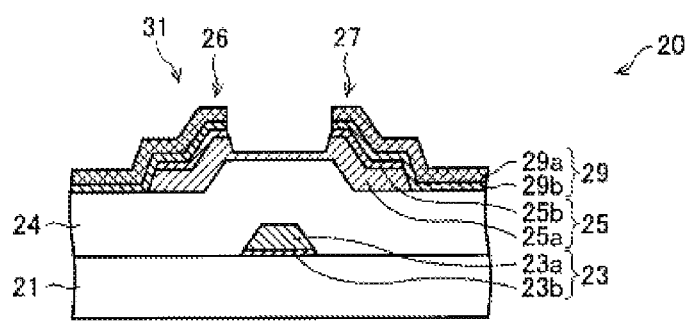
Figure 8:
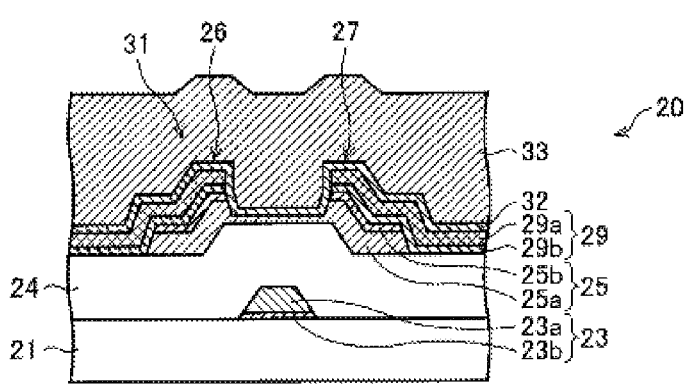
Figure 8:
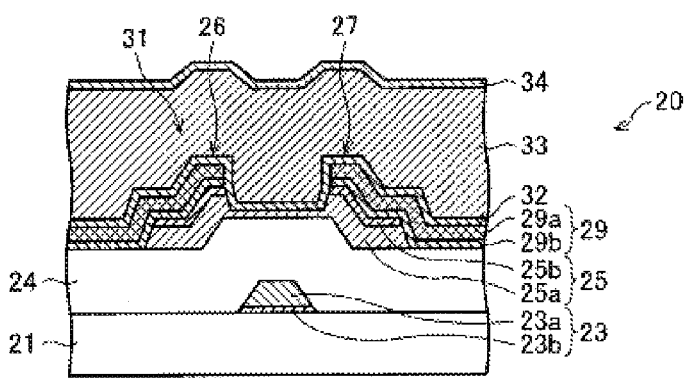
Figure 9:
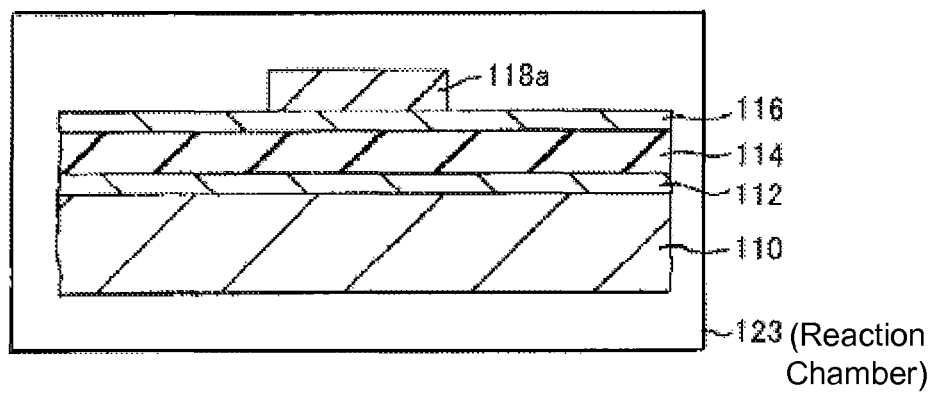
FIGS. 9(a) and 9(b) are explanatory diagrams for the conventional method of forming the Cu wiring.
Figure 9:
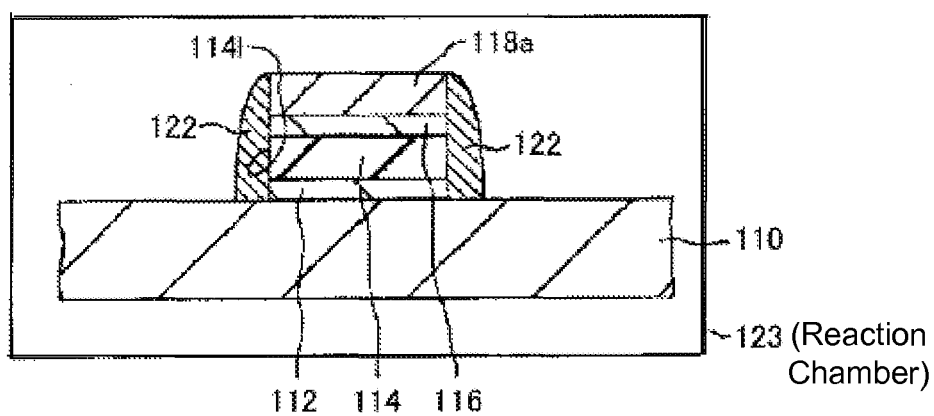

In each of the above methods of forming the wiring, when the liner film 13 is an insulating film, by removing the edges 13b of the liner film 13 that protrude in an eaves shape over the Cu wiring 12a as described above, the liner film 13 that is formed on the Cu wiring 12a can be directly used as part of an insulating film that covers the Cu wiring 12a (such as a gate insulating film (GI) shown in FIGS. 6(a) to 6(d) or an inorganic interlayer insulating film 32 shown in FIGS. 8(c) and 8(d), which will be described later, for example).

When the liner film 13 is a metal film, by removing the edges 13b of the liner film 13 that protrude in an eaves-like shape over the Cu wiring 12a as described above, the liner film 13 can be directly used as part of the wiring. That is, the liner film 13 can be directly used as upper layer wiring in double layer wiring that has the Cu wiring 12a as lower layer wiring, for example.

It is apparent that the entire liner film 13 may be removed instead of removing the edges 13b of the liner film 13 that protrude in an eaves-like shape over the Cu wiring 12a.

<Structure of Semiconductor Substrate (TFT Substrate) Including Cu Wiring>

Next, a method of manufacturing a semiconductor substrate that includes the Cu wiring using the above method of forming the Cu wiring will be described. Below, a TFT substrate in an active matrix liquid crystal display device (active matrix substrate) will be described as an example of the semiconductor substrate.

First, a structure of the TFT substrate will be described with reference to FIG. 4.

Figure 4:
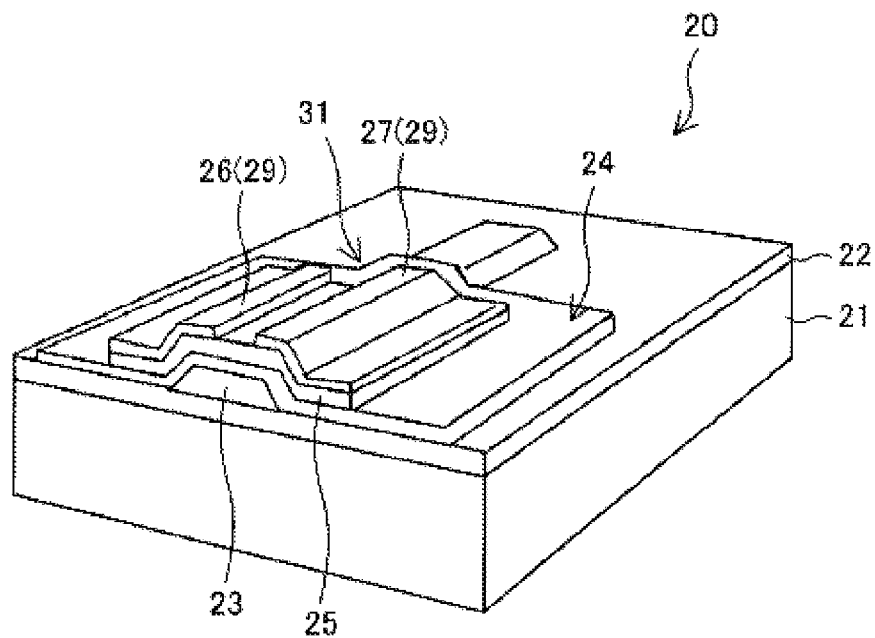
FIG. 4 is a schematic view showing a structure of a TFT substrate that is formed by a manufacturing method according to an embodiment of the present invention.

FIG. 4 shows a partial structure of the TFT substrate formed by the manufacturing method of the present embodiment. In FIG. 4, one of the TFTs 31 that constitute a TFT substrate 20 is shown.

As shown in FIG. 4, in the TFT substrate 20, a base coat film 22 is deposited on the glass substrate 11, and a gate electrode layer 23 is formed thereon in a prescribed shape. The gate electrode layer 23 constitutes a gate electrode of the TFT 31, and also constitutes scan signal wiring and the like. On the gate electrode layer 23, a gate insulating film 24 is formed.

On the gate insulating film 24, a semiconductor layer 25 is formed in a prescribed shape. On the semiconductor layer 25, a source electrode layer 29 is formed.

The source electrode layer 29 is patterned in a prescribed shape, and constitutes a source electrode 26, a drain electrode 27, and the like. Although not shown, the source electrode layer 29 also constitutes data signal wiring that is connected to the source electrode 26.

The TFT 31 is constituted of the gate electrode, the source electrode 26, and the drain electrode 27, sandwiching the semiconductor layer 25 therebetween.

In the TFT substrate 20, conductive films that constitute the respective electrodes and wiring contain Cu.

<Method of Manufacturing TFT Substrate>

Next, a method of manufacturing the TFT substrate 20 having the above configuration will be described below with reference to FIGS. 5(a) to 5(d) through FIGS. 8(a) to 8(d).

FIGS. 5(a) to 5(d) and FIGS. 7(a) to 7(d) show a process of manufacturing the TFT substrate 20 in the process sequence.

FIGS. 5(a) to 5(d) and FIGS. 7(a) to 7(d) show plan views of the TFT substrate 20 that changes at each step.

FIGS. 6(a) to 6(d) and FIGS. 8(a) to 8(d), which correspond to FIGS. 5(a) to 5(d) and FIGS. 7(a) to 7(d), respectively, show cross-sectional views of the TFT substrate 20 that changes at each step.

FIGS. 6(a) to 6(d) and FIGS. 8(a) to 8(d) respectively show cross-sectional views of the TFT substrate 20 along the lines X-X in FIGS. 5(a) to 5(d) and FIGS. 7(a) to 7(d).

Figure 5:
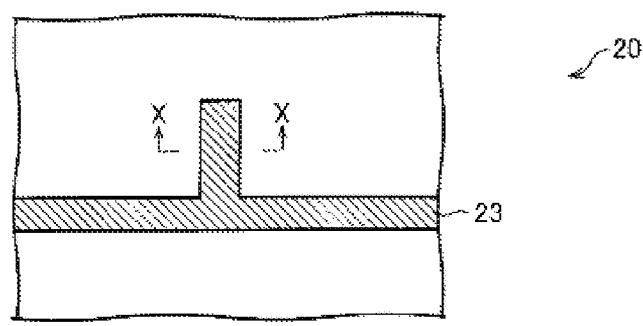
FIGS. 5(a) to 5(d) are plan views for explaining process steps in the method of manufacturing a semiconductor substrate according to an embodiment of the present invention.
Figure 5:
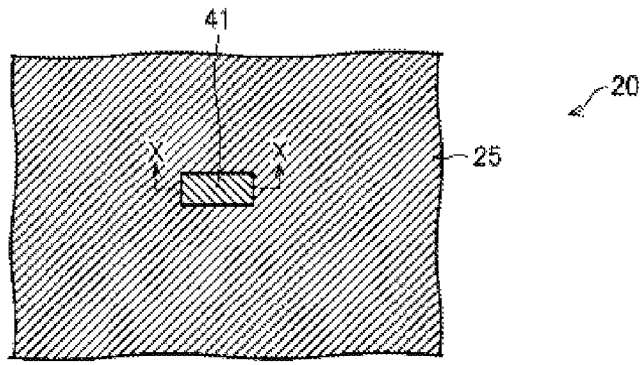
Figure 5:
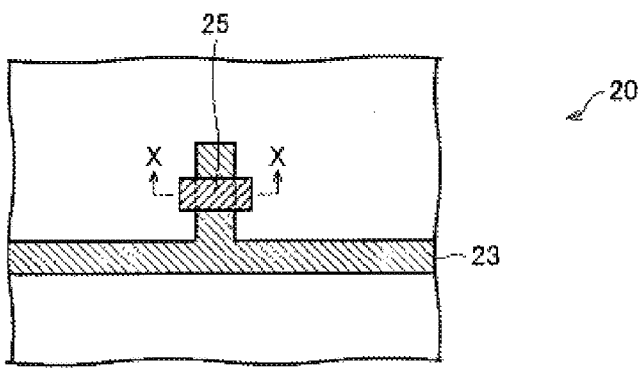
Figure 5:
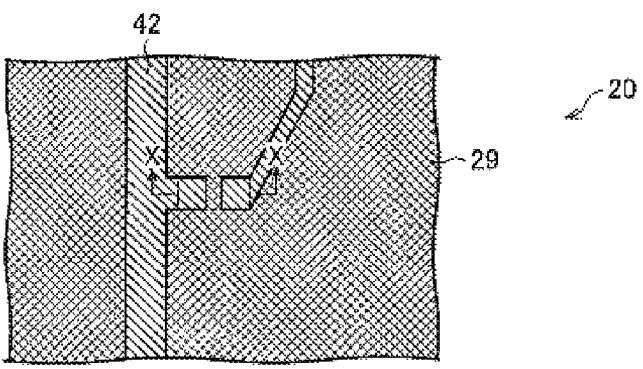
Figure 6:
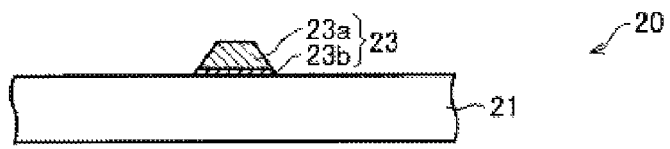
FIGS. 6(a) to 6(d) are cross-sectional views for explaining the process steps in the method of manufacturing the semiconductor substrate according to an embodiment of the present invention.
Figure 6:
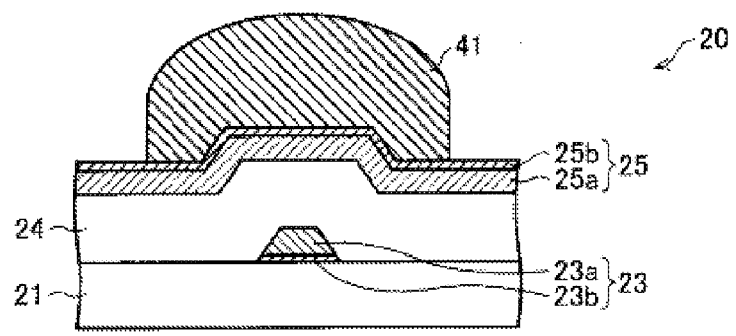
Figure 6:
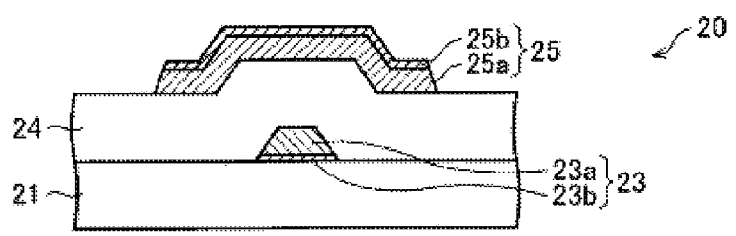
Figure 6:
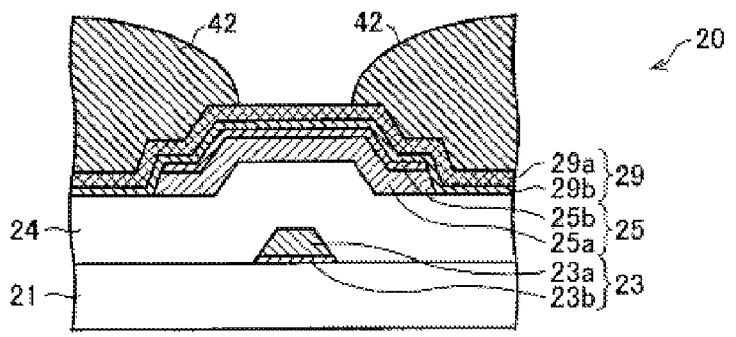

First, as shown in FIGS. 5(a) and 6(a), the base coat film 22 (not shown) is deposited on a glass substrate 21 with a thickness of 10 to 50 nm, for example by sputtering. The gate electrode layer 23 is deposited thereon.

As shown in FIG. 6(a), the gate electrode layer 23 is formed by depositing a Cu conductive film 23a (Cu layer) on a Ti conductive film 23b (Ti layer).

The thickness of the Ti conductive film 23b is 10 to 100 nm, for example. The thickness of the Cu conductive film 23a is 200 to 500 nm, for example. The base coat film 22 does not necessarily need to be provided.

The gate electrode layer 23 is formed by patterning the Cu conductive film 23a in a prescribed shape in the same manner as the Cu thin film 12, which is the Cu conductive film, by a process similar to that shown in FIGS. 1(a) to 1(e) according to the method of forming the Cu wiring described above.

More specifically, on the Cu conductive film 23a, an insulating film (not shown) such as SiN that is used as a liner film is deposited, and thereafter, the insulating film is patterned in a prescribed shape by forming a photoresist (not shown) in a prescribed shape and performing isotropic dry etching.

Thereafter, the photoresist is removed. Then, the Cu conductive film 23a, which is the main conductive film, is partially removed by isotropic wet etching using the liner film (not shown) made of the patterned insulating film as an etching mask.

The liner film, the insulating film, and the photoresist respectively correspond to the liner film 13, the insulating film 131, and the photoresist 14 shown in FIGS. 1(a) to 1(e).

The Ti conductive film 23b, which is provided under the Cu conductive film 23a, can be etched and patterned at the same time as etching the Cu conductive film 23.

As a result, as shown in FIGS. 5(a) and 6(a), the gate electrode layer 23 that constitutes the gate electrode and the scan signal line are formed.

Because FIGS. 1(e) and 3(e) show the simplified Cu wiring 12a, the shape of the cross section of the Cu wiring 12a shown in FIGS. 1(e) and 3(e) is different from the shape of the cross section of the gate electrode layer 23 (Cu conductive film 23a, in particular) shown in FIG. 8(a). However, the difference in the shape of the cross sections does not diminish the effects of the method of forming the wiring described above.

The Cu wiring (Cu conductive film) can be patterned in any appropriate shapes depending on the type of the liner film and the etching direction.

Next, as shown in FIG. 6(b), the gate insulating film (GI) 24 is deposited by the CVD method so as to cover the gate electrode layer 23. The thickness of the gate insulating film 24 is 200 to 500 nm, for example.

Thereafter, as shown in FIGS. 5(b) and 6(b), the semiconductor layer 25 is deposited by the CVD method.

The semiconductor layer 25 is constituted of an amorphous silicon film (a-Si layer) 25a that is not doped with an impurity and an $n^+$ amorphous silicon film ($n^+$ layer) 25b that is doped with an impurity.

The thickness of the amorphous silicon film (a-Si layer) 25a is 50 to 200 nm, for example. The thickness of the $n^+$ amorphous silicon film ($n^+$ layer) 25b is 10 to 70 nm, for example.

In order to pattern the deposited semiconductor layer 25 in a prescribed shape, a photoresist 41 is patterned in a prescribed shape by the photolithography as shown in FIGS. 5(b) and 6(b). Next, by performing dry etching, the semiconductor layer 25 that is not covered by the photoresist 41 is removed, and the gate insulating film 24 is exposed.

In this etching, typical dry etching using a fluorine gas or a chlorine gas is employed. For etching a semiconductor layer containing Si by dry etching, for example, a fluorine gas such as $CF_4$, $SF_6$, or $NF_3$, or a chlorine gas such as $Cl_2$, HCl, or $BCl_3$ is used.

According to the above process, the island-shaped semiconductor layer 25 is formed as shown in FIGS. 5(c) and 6(c).

Next, the source electrode layer 29 is deposited by sputtering so as to cover the semiconductor layer 25 as shown in FIGS. 5(d), 6(d), 7(a), and 8(a).

The source electrode layer 29 is formed in the same manner as the gate electrode layer 23 by depositing a Cu conductive film 29a on a Ti conductive film 29b as shown in FIGS. 6(d) and 8(a).

The thickness of the Ti conductive film 29b is 10 to 100 nm, for example. The thickness of the Cu conductive film 29a is 200 to 500 nm, for example.

Next, in order to pattern the source electrode layer 29 in a prescribed shape, a photoresist 42 is patterned in a prescribed shape by the photolithography as shown in FIGS. 5(d), 6(d), 7(a), and 8(a).

Figure 7:
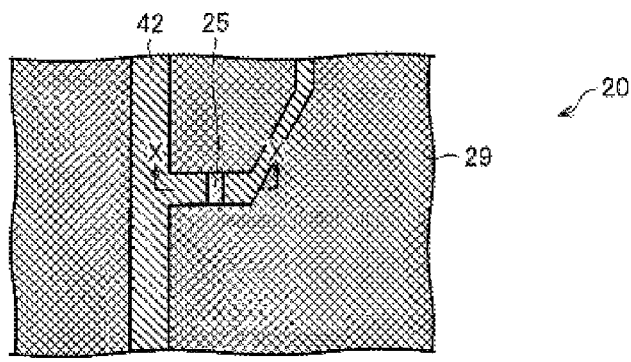
FIGS. 7(a) to 7(d) are plan views for explaining process steps in the method of manufacturing the semiconductor substrate according to an embodiment of the present invention.
Figure 7:
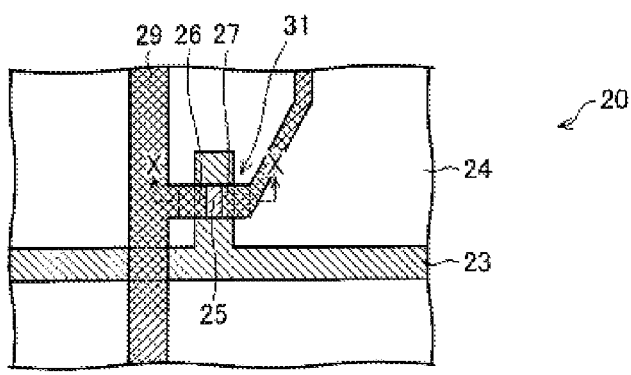
Figure 7:
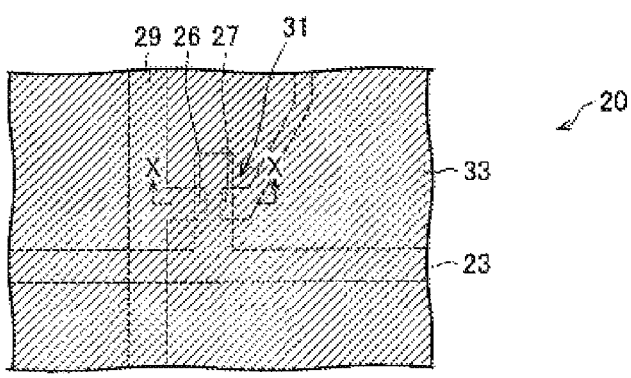
Figure 7:
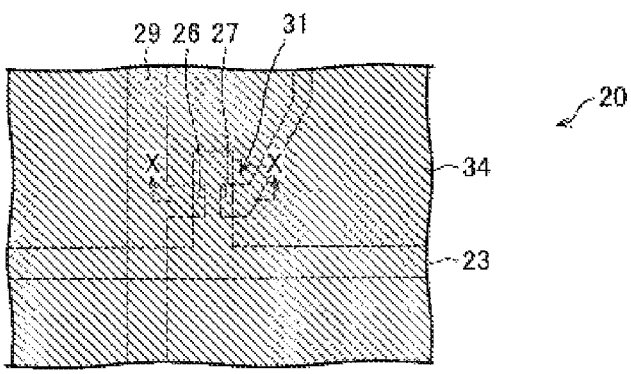

Then, as shown in FIGS. 7(b) and 8(b), a channel portion of the TFT 31 is etched and removed by wet etching and dry etching, forming the TFT 31.

In patterning the source electrode layer 29, the method of forming the Cu wiring described above (see FIGS. 1(a) to 1(e)) can also be applied.

More specifically, first, before forming the photoresist 42, an insulating film such as SiN (not shown), which is used for a liner film, is deposited on the source electrode layer 29.

Next, the photoresist 42 that is deposited on the insulating film is patterned in a prescribed shape by the photolithography. Thereafter, by performing isotropic dry etching, the insulating film is patterned in a prescribed shape.

Thereafter, the photoresist 42 is removed. Then, the Cu conductive film 29a, which is the main conductive film, is partially removed by isotropic wet etching using the liner film that is made of the patterned insulating film as an etching mask.

As a result, the source electrode 26, the drain electrode 27, and the data signal wiring made of the Cu conductive film 29a are patterned in a prescribed shape.

The liner film, the insulating film, and the photoresist respectively correspond to the liner film 13, the insulating film 131, and the photoresist 14 shown in FIGS. 1(a) to 1(e).

The Ti conductive film 29b, which is provided under the Cu conductive film 29a, may be etched and patterned at the same time as etching the Cu conductive film 29a, or the Ti conductive film 29b may be etched at the same time as etching the semiconductor layer 25, which will be performed later.

The method of patterning the Ti conductive film 29b can be appropriately selected according to the material for the insulating film (liner film) formed on the Cu conductive film 29a.

Thereafter, the $n^+$ amorphous silicon film 25b in the semiconductor layer 25 is removed by dry etching, forming a channel region from which the amorphous silicon film (a-Si layer) 25a is exposed. When etching the semiconductor layer 25, a chlorine gas or a fluorine gas is used, and a pressure of several Torrs to several tens of Torrs is applied, for example.

According to the above process, the TFT 31 is formed as shown in FIGS. 7(b) and 8(b).

Next, as shown in FIGS. 7(c) and 8(c), an inorganic interlayer insulating film 32 (Pas; see FIG. 8(c)) and an organic interlayer insulating film 33 (JAS) are deposited on the entire TFT substrate 20 by the CVD method.

The thickness of the inorganic interlayer insulating film 32 formed here is 70 to 300 nm, for example. The thickness of the organic interlayer insulating film 33 formed here is 500 to 3000 nm, for example.

Thereafter, as shown in FIGS. 7(d) and 8(d), a transparent conductive layer 34 such as ITO (or IZO) for forming a pixel electrode is deposited. Next, the pixel electrode that is patterned in a prescribed shape is formed by the photolithography.

Although not shown, the pixel electrode (ITO) 34 is electrically connected to the drain electrode 27 via a contact hole that is formed in the inorganic interlayer insulating film 32 and the organic interlayer insulating film 33.

As described above, the method of manufacturing the semiconductor substrate according to the present embodiment includes patterning the gate electrode layer and the source electrode layer that are formed on the semiconductor substrate, and patterning the semiconductor elements such as TFTs and the wiring by using the above method of forming the metal wiring that contains Cu.

According to this method, when using the Cu conductive film as a wiring material, an effect in which the wiring can be formed to the design width and height can be achieved.

More specifically, the method of forming the wiring according to the present embodiment includes: depositing a metal thin film that contains Cu on a base member; forming, on the metal thin film, an insulating film or a metal thin film that does not contain Cu (i.e., a film chosen from a group of (1) an insulating film and (2) a metal film that does not contain Cu); patterning a photoresist by the photolithography on the insulating film or the metal film that does not contain Cu, etching the insulating film or the metal film that does not contain Cu by isotropic dry etching using the photoresist as an etching mask; and forming metal wiring by removing the photoresist after the insulating film or the metal film that does not contain Cu is etched, and etching the metal thin film by isotropic wet etching using the insulating film or the metal film that does not contain Cu as an etching mask so as to partially remove the metal thin film.

In the above method of manufacturing the semiconductor substrate, the gate electrode layer and the source electrode layer that contain Cu are patterned by using the above method of forming the wiring, thereby forming the semiconductor elements and the wiring.

In the above method of forming the wiring, it is preferable that the insulating film be made of SiN or SiON.

According to the above method of forming the wiring, by making the insulating film of SiN or SiON, the adhesion between the photoresist and the insulating film can be further increased.

In the above method of forming the wiring, it is preferable to use molybdenum, tungsten, chrome, molybdenum nitride, titanium nitride, or tungsten nitride as a material of the metal film that does not contain Cu.

According to the above method of forming the wiring, by using molybdenum, tungsten, chrome, molybdenum nitride, titanium nitride, or tungsten nitride as a material of the metal film that does not contain Cu, the adhesion between the photoresist and the metal film that does not contain Cu can be further increased.

It is preferable that the above method of forming the wiring further include removing the edges of the insulating film or of the metal film that does not contain Cu, which is formed on the metal wiring that contains Cu, by sputter etching.

According to the above method of forming the wiring, the edges of the insulating film or of the metal film that does not contain Cu protruding from the metal wiring can be removed. Moreover, it is preferable that Ar ions be used for sputter etching.

In the above method of forming the wiring, the metal thin film that contains Cu may have a multilayer structure of a Ti layer and a Cu layer.

In the above method of manufacturing the semiconductor substrate, the semiconductor elements are TFTs, LSIs, thin-film solar battery elements, micromachines, or the like, for example. Moreover, an active matrix substrate can be given as an example of the semiconductor substrate.

The present invention is not limited to the above embodiment, and various modifications can be made without departing from the scope of the claims. Embodiments that can be obtained by appropriately combining techniques disclosed in different embodiments, respectively, are also included in the technical scope of the present invention.

Industrial Applicability

According to the method of forming the wiring and the method of manufacturing the semiconductor substrate of the present invention, the Cu wiring can be formed to the design width and height. Therefore, the methods of the present invention can be applied to the manufacture of a semiconductor substrate that is included in a display device and the like.

DESCRIPTION OF REFERENCE CHARACTERS 11 glass substrate (base member)
12 Cu thin film (metal thin film that contains Cu)
12a Cu wiring (metal wiring that contains Cu)
13 liner film (SiN film, insulating film)
13b edge
14 photoresist
20 TFT substrate (semiconductor substrate, active matrix substrate)
21 glass substrate
22 base coat film
23 gate electrode layer
23a Cu conductive film (Cu layer)
23b Ti conductive film (Ti layer)
24 gate insulating film
25 semiconductor layer
25a amorphous silicon film
25b amorphous silicon film
26 source electrode
27 drain electrode
29 source electrode layer
29a Cu conductive film (Cu layer)
29b Ti conductive film (Ti layer)
31 TFT (semiconductor element)
32 inorganic interlayer insulating film
33 organic interlayer insulating film
34 pixel electrode
34 transparent conductive layer
41 photoresist
42 photoresist
131 insulating film (SiN film)

The invention claimed is:

1. A method of forming wiring, comprising:
depositing a metal thin film that contains Cu on a base member;
forming a metal film that does not contain Cu on the metal thin film;
patterning a photoresist by photolithography on the metal film that does not contain Cu;
etching the metal film that does not contain Cu by isotropic dry etching using the photoresist as an etching mask; and
forming metal wiring by removing the photoresist after the metal film that does not contain Cu is etched, and etching the metal thin film by isotropic wet etching using the metal film that does not contain Cu as an etching mask so as to partially remove the metal thin film,
wherein the metal film that does not contain Cu is formed by using molybdenum, tungsten, chrome, molybdenum nitride, titanium nitride, or tungsten nitride as a material thereof.

2. The method of forming the wiring according to claim 1, further comprising removing an edge of the metal film that does not contain Cu, which is formed on the metal wiring that contains Cu, by sputter etching.

3. The method of forming the wiring according to claim 1, wherein the metal thin film that contains Cu has a multilayer structure of a Ti layer and a Cu layer.

4. A method of manufacturing a semiconductor substrate, comprising forming a semiconductor element and wiring by patterning a gate electrode layer and a source electrode layer that contain Cu using the method of forming wiring according to claim 1.

5. The method of manufacturing a semiconductor substrate according to claim 4, wherein the semiconductor substrate is an active matrix substrate.

* * * * *